United States Patent [19]

Landreau et al.

[11] 4,341,570
[45] Jul. 27, 1982

[54] PROCESS FOR PRODUCING AN INJECTION LASER AND LASER OBTAINED BY THIS PROCESS

[76] Inventors: Jean Landreau, 107 Avenue de Verdun, 92130 Issy les Moulineaux; Philippe Delpech, 37 rue Louise Michel, 94800 Villejuif; Jean-Claude Bouley, 35 Avenue du Docteur Durand, 94110 Arcueil, all of France

[21] Appl. No.: 183,730

[22] Filed: Sep. 3, 1980

[30] Foreign Application Priority Data

Sep. 11, 1979 [FR] France .............................. 79 22650

[51] Int. Cl.$^3$ .............................................. H01S 3/00
[52] U.S. Cl. ................................................... 148/1.5
[58] Field of Search ................... 148/1.5; 331/94.5 H; 357/18

[56] References Cited

U.S. PATENT DOCUMENTS

| | | | |
|---|---|---|---|
| 3,349,475 | 10/1967 | Marinace | 148/1.5 |
| 3,914,465 | 10/1975 | Dyment et al. | 148/187 |
| 3,982,207 | 9/1976 | Dingle et al. | 357/18 |
| 3,984,262 | 10/1976 | Burnham et al. | 148/187 |
| 4,023,993 | 5/1977 | Scifres et al. | 148/187 |
| 4,124,826 | 11/1978 | Dixon et al. | 331/94.5 H |
| 4,230,997 | 10/1980 | Hartman et al. | 357/18 |

OTHER PUBLICATIONS

Harris et al., IBM Technical Disclosure Bulletin; vol. 16, #1, Jun. 1973, pp. 171–172.
Bouley et al., IEEE Journal of Quantum Electronics, vol. QE-15, 1979, pp. 767–771.

*Primary Examiner*—Arthur P. Demers
*Attorney, Agent, or Firm*—Kerkam, Stowell, Kondracki & Clarke

[57] ABSTRACT

Process for producing an injection laser and laser obtained by this process. The active layer is weakly n doped. The same mesa is used for carrying out a proton implantation and a zinc diffusion. The active stripe is transversely limited by two homojunctions and two index jumps and the final structure is planar. In addition, there is an auto-alignment of the implanted and diffused zones.

Application to the construction of lasers used in optical telecommunication systems.

4 Claims, 6 Drawing Figures

PROCESS FOR PRODUCING AN INJECTION LASER AND LASER OBTAINED BY THIS PROCESS

BACKGROUND OF THE INVENTION

The present invention relates to a process for producing an injection laser and to a laser obtained by this process. It is intended more particularly for use in optical telecommunications.

The injection laser according to the invention is of the double heterostructure type. Such a structure comprises a monocrystalline substrate in which are deposited by liquid phase epitaxy four layers of semiconductor materials, successively constituted by:
a first n-doped confinement layer,
a second active layer, generally based on p-doped gallium arsenide,
a third p-doped confinement layer,
a fourth p+-doped contact layer.

According to a known procedure, the surface of the optically active zone is reduce by limiting it to a thin stripe obtained by making part of the third and fourth layers electrically neutral. This neutralization is brought about by subjecting the structure previously covered with a mask corresponding to the desired stripe to a proton bombardment.

In particular, lasers of this type are known which emit at about 0.85 μm and which comprise:
a first confinement layer of composition $Ga_{1-x}Al_xAs$ in which x is a number below 1 (generally between 0.3 and 0.5) said layer being n-doped,
a second active layer of composition $Ga_{1-y}Al_yAs$ (y being generally a number below 0.1), said layer generally being p-doped,
a third confinement layer of composition $Ga_{1-z}Al_zAs$, (z being a number below 1) said layer also being p-doped;
finally, a fourth contact layer of composition GaAs and p+-doped.

For more details on these known structures and the materials used, reference can be made, for example, to the article by J. P. NOBLANC entitled "Fibre optical communications devices" published in the Journal "Applied Physics", 13, pp. 221-223, 1977 or in the work by H. KRESSEL and J. K. BUTLER entitled "Semiconductor laser and heterojunction leds" published by Academic Press.

The stripe structure makes it possible to limit the extent of the electrically excited region to a rectangular surface only a few microns wide (approximately 10 μm) and a few hundred microns long (300 to 500μ). The threshold currents for the appearance of laser emission then become compatible with continuous operation at ambient temperature.

Numerous procedures have been developed for forming such stripes and they can be classified into two categories;

(a) In the first category, the optical beam is guided by the amplification gain profile (lasers guided by the gain), such lasers being of the type most frequently encountered. The technology used may call on:
photon bombardment as described in the article entitled
"Optical and electrical properties of proton bombardment of p-type GaAs" published by J. C. DYMENT et al in the Journal "Journal of Applied Physics", Vol. 44, No. 1, January 1973, pp. 207-213;
the opening of a window in the contact layer by means of a layer of silica, as described in the article entitled "Advances in GaAs junction lasers with stripe geometry", published by L. D. D'ASARO in the "Journal of Luminescense", Vol. 7, pp. 310-337, 1973;
a selective diffusion of zinc, as described in the article entitled "A $GaAs-Al_xGa_{1-x}As$ Double Heterostructure Planar Stripe Lasers" by H. YONEZU et al, published in the Journal "Japanese Journal of Applied Phsyics", Vol. 12, No. 10, pp. 1585-1592, October 1973.

(b) In this second category, the optical beam is guided by a refractive index gradient "Lasers guided by the index". Generally this consists of an index step which is higher in the stripe than outside it. Compared with lasers guided by the gain, this type of laser has a better linearity of the optical power emitted as a function of the current. Numerous laser structures guided by the index have been described in the literature, reference being made e.g. to the following:
the laser with a channel substrate planar (C.S.P) structure described in the article entitled "Channel substrate planar structure (AlGa)As injection lasers" by K. AIKI et al and published in the Journal "applied physics letters", Vol. 30, No. 12, pp. 649-651, June 16th 1977 in which the indexed profile is obtained by forming in the substrate a channel with a width of a few microns and the type n confinement layer then has a variable thickness which induces an index jump level with the channel;
the laser with a selective zinc diffusion in the active region which brings about an index step by electronic compensation of the impurities present and as described in the article entitled "New stripe geometry laser with high quality lasing characteristics by horizontal transverse mode stabilization-a refractive index guiding with Zn doping" by H. YONEZU et al, published in "Japanese Journal of Applied Physics", Vol. 16, No. 1, pp. 209-212, 1977.

The "buried" laser where the active GaAs part is completely surrounded by GaAlAs with a lower optical index than GaAs and as described in the article entitled "$GaAs-Ga_{1-x}Al_xAs$ buried-heterstructure injection lasers" published by T. TSUKADA in the "Journal of Applied Physics", Vol. 45, No. 11, pp. 4899-4906, November 1974.

Finally, the laser described in the article by J. C. Bouley et al and entitled "A stabilized zinc diffused, proton bombarded (GaAl)As laser" published in IEEE Quantum Electronics, August 1979, this laser being guided by the index in which an index step is obtained by zinc diffusion, said diffusion affecting the sides of the stripe.

Lasers with an index profile all lead to a certain number of technological difficulties. These difficulties may be due to the need of carrying out liquid epitaxy in two stages (case of the laser with a buried structure) or through it being necessary to accurately control the diffusion depth (Case of the laser with "selective diffusion") or due to obtaining an alignment of optical stripe and the electric stripe where pumping takes place (Case of the C.S.P laser).

The structure described in the article by J. C. BOULEY et al has the disadvantage of having a mesa above the stripe. Therefore, this structure is not planar, which leads to problems when welding the system to its base. In addition, technological difficulties occur during the alignment of non-diffused and non-bombarded stripes.

BRIEF SUMMARY OF THE INVENTION

The object of the invention is to propose a novel process for producing a heterostructure laser of the type in which there is a proton bombardment and a zinc diffusion, but in which there is an auto-alignment of the non-diffused and non-bombarded stripes, which contributes to a reduction in the operating current of the laser and in addition, this process leads to a planar structure which facilitates the assembly of the device.

According to the invention, this object is achieved by the following operations:

(A) A conventional double heterostructure is formed (n-type substrate, n-type first confinement layer, active layer, second confinement layer and $P^+$-type contact layer), but the active layer is of the weakly doped n-type;

(B) a masking layer is deposited on the contact layer and its composition is similar to that of the confinement layers;

(C) the latter layer is chemically etched so as to only leave behind a masking "mesa";

(D) zinc diffusion is performed using said "mesa" as the mask, the diffusion time being sufficiently great for the diffusion to affect the active zone;

(E) there is proton bombardment of the structure by once again using the "mesa" as the mask, the bombarded zone also extending beyond the active zone;

(F) the "mesa" is eliminated.

The structure obtained results directly from these operations. It is a double heterostructure laser obtained with an active layer having a weakly n-doped central portion (i.e. where the zinc diffusion is non-existent) and p-doped lateral portions (due to the diffusion). This leads to a distribution of the refractive index in the form of a step which improves the propagation conditions for the light beam leading to a transverse optical confinement and to two lateral homojunctions which bring about a transverse electrical confinement.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
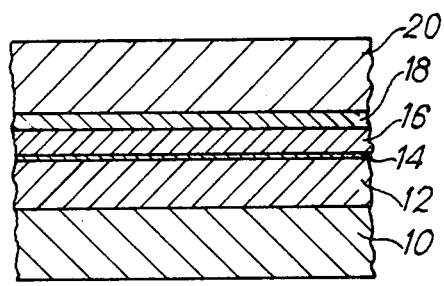
FIGS. 1 to 5 the successive stages of the production process according to the invention.

The different stages of the process are as follows:
(1) Formation of a double heterostructure by liquid phase epitaxy (FIG. 1), which comprises:
a substrate 10,
a first confinement layer 12,
an active layer 14,
a second confinement layer 16,
a contact layer 18,
and finally, a masking layer 20.

The following table summarises the characteristics of the different layers, the values given being only intended for reference purposes.

Figure 2:
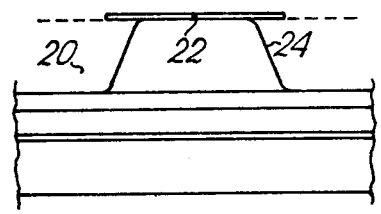

(2) Deposition of a resin layer 22, followed by the treatment thereof by photogravure and chemical etching by an $H_2O_2$, $H_2SO_4$ and $H_2O$ solution (8:1:1 volumes at 10° C., etching rate 0.1 $\mu$m/s) so as to leave behind only a stripe 24 of approximate width 20 $\mu$m in the masking layer 22 (FIG. 2).

Figure 3:
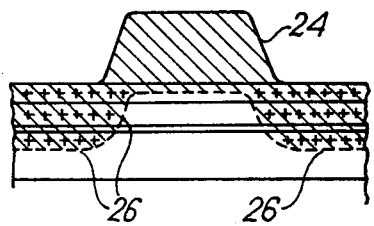

(3) Zinc diffusion carried out in a sealed ampoule with saturated zinc vapour at 590° C. The diffusion rate is dependent on the nature of the materials. After 60 minutes diffusion, a depth of 2–9 $\mu$m is obtained in GaAlAs and 1.12 $\mu$m in GaAs. The diffusion front is adjusted so as to extend beyond the active zone 14 by approximately 1 $\mu$m in the lateral regions not masked by stripe 24. The profile of the diffused area carries the reference numeral 26 in FIG. 3.

Figure 4:
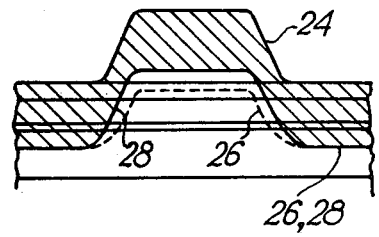

(4) Proton bombardment (FIG. 4) which is carried out by using protons of energy 300 keV. The implantation profile is given the reference numeral 28 and is substantially rectilinear beneath the masking mesa, whilst the diffusion profile 26 is slightly rounded due to the zinc diffusion beneath the mesa. The non-implanted stripe is therefore slightly wider than the non-diffused stripe. Outside the masked area, the bombarded region has substantially the same thickness as the diffused region and profiles 26 and 28 coincide.

Figure 5:
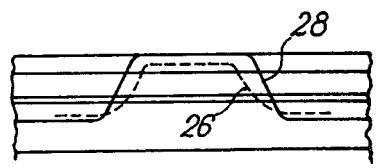

(5) Elimination of the masking stripe (FIG. 5), which is carried out by chemical etching with pure hydrofluoric acid over a period of a few minutes. The acid does not etch the GaAs surface layer. The connection of contacts to parts p and n of the structure and the following assembly takes place in the same way as for conventional lasers.

Figure 6:
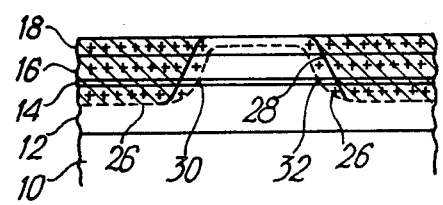
FIG. 6 a sectional view of the final structure obtained.

The structure is illustrated in cross-section in FIG. 6. At the boundary between the weakly n-doped central channel and the p-doped lateral regions in active layer 14 there are two homojunctions 30 and 32 laterally defining the channel and permitting a transverse electrical confinement. These homojunctions coincide with the index change zones, which bring about the optical confinement. Moreover, it is obvious that through the use of a single mask 24 for the two operations of implantation and diffusion ipso facto leads to an auto-alignment of the implanted and diffused zones.

The use according to the invention of a zinc diffusion for providing an index step is in certain respects similar to the method described by H. YONEZU et al in the article referred to hereinbefore. However, in actual fact, the two methods are quite different for the following reasons. In the prior art method, the active layer is n-doped and zinc diffused affects the active stripe because it is a question of reducing the doping of the stripe, whilst maintaining its n character. The active layer then has an n-type doping throughout with a lower value in the central area where stimulated emission occurs. In view of the fact that the lower the n doping the higher the refractive index, there is an index step with a high index in the stripe and a low index in the lateral zones.

Such a procedure causes numerous problems because it is a question of finely compensating the active layer, which requires an extremely accurate control of the zinc diffusion depth. Moreover, compensation affects the very zone where stimulated emission takes place, which is not advantageous because any homogeneity defect in this zone immediately leads to anomalies on the optical beam.

The method according to the invention obviates this problem by recommending zinc diffusion outside the active stripe. In addition, it is no longer a question of slightly compensating the n doping of the active layer, but of giving the latter a very marked p character. Thus, there is a greatly reduced constraint in the diffusion depth. Finally and as seen hereinbefore the p character of the diffused lateral zones combined with the n character of the central stripe leads to two homojunctions in the active layer which electrically define the active stripe, leading to the advantages referred to hereinbefore.

The method described by J. C. BOULEY et al in the article referred to hereinbefore involves increasing p doping of the active layer outside the active stripe. Thus, the weaker the p doping, the higher the index. In this method, there is no action on the active zone, which reduces the difficulties inherent in regulating the diffusion depth, but no homojunctions are obtained because the active layer is p-doped throughout its surface area.

TABLE

| Layer identity | Reference numeral on drawings | Composition | Doping dopant | Doping type | doping cm$^{-3}$ | Thickness $\mu$m |
|---|---|---|---|---|---|---|
| Masking layer | 20 | Ga$_{0.4}$Al$_{0.6}$As | Ge | (p) | 10$^{18}$ | 6 |
| Contact layer | 18 | Ga As | Ge | (p) | 10$^{19}$ | 0.5 |
| Second confinement layer | 16 | Ga$_{0.65}$Al$_{0.35}$As | Ge | (p) | 10$^{18}$ | 1 |
| Active layer | 14 | Ga As | | (n) | 10$^{16}$ | 0.2 |
| First confinement layer | 12 | Ga$_{0.65}$Al$_{0.35}$As | Sn | (n) | 10$^{17}$ | 4 |
| Substrate | 10 | Ga As | Si | (n) | 10$^{18}$ | 100 |

What is claimed is:

1. A process for producing an injection laser with a double heterostructure incorporating on a substrate a first confinement layer, an active layer, a second confinement layer and a contact layer, wherein:

(A) a conventional double heterostructure is formed (n-type substrate, n-type first confinement layer, active layer, second confinement layer and P$^+$-type contact layer), but the active layer is of the weakly doped n-type;

(B) a masking layer is deposited on the contact layer and its composition is similar to that of the confinement layers;

(C) the latter layer is chemically etched so as to only leave behind a masking mesa;

(D) zinc diffusion is performed using said mesa as the mask, the diffusion time being sufficiently great for the diffusion to affect the active zone;

(E) there is proton bombardment of the structure by once again using the mesa as the mask, the bombarded zone also extending beyond the active zone;

(F) the mesa is eliminated.

2. A process according to claim 1, wherein by liquid phase epitaxy a double heterostructure is formed which comprises an n-doped Ga As substrate, a first n-doped confinement layer of composition Ga$_{1-x}$Al$_x$As with x between 0.3 and 0.5, a weakly-doped active layer of composition Ga$_{1-y}$Al$_y$As with y below 0.1, a second p-doped confinement layer of composition Ga$_{1-x}$Al$_x$As and a strongly p$^+$-doped GaAs contact layer, a masking layer of composition Ga$_{1-y}$Al$_y$As with y between 0.5 and 0.7 being deposited on the contact layer.

3. A laser obtained by the process of claim 1 comprising a double heterostructure constituted by a substrate, a first confinement layer, an active layer, a second confinement layer and a contact layer, the three latter layers having undergone neutralization by proton bombardment, except along a thin stripe located in the centre of the structure, wherein in the said strip the active layer has a weak n-type doping and on either side of said stripe a doped region which is of the p-type as a result of the diffused zinc, so that laterally the stripe is defined by two homojunctions which coincide with two zones having a refractive index change.

4. A laser according to claim 3, wherein the substrate is of n-doped Ga As, the composition of the first confinement layer is Ga$_{1-x}$A$_x$As with x between 0.3 and 0.5 and its doping is of the n type, the composition of the active layer is Ga$_{1-y}$Al$_y$As with y below 0.1 and its doping of the n-type, the composition of the second confinement layer is Ga$_{1-x}$Al$_x$As and its doping is of the p-type and the contact layer is of Ga As and is p$^+$-doped.

* * * * *